US012787321B2

(12) United States Patent
Marzaki

(10) Patent No.: US 12,787,321 B2
(45) Date of Patent: Nov. 3, 2026

(54) METHOD FOR MANUFACTURING A SCHOTTKY DIODE AND CORRESPONDING INTEGRATED CIRCUIT

(71) Applicant: STMicroelectronics (Rousset) SAS, Rousset (FR)

(72) Inventor: Abderrezak Marzaki, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 616 days.

(21) Appl. No.: 18/224,293

(22) Filed: Jul. 20, 2023

(65) Prior Publication Data

US 2024/0030357 A1 Jan. 25, 2024

(30) Foreign Application Priority Data

Jul. 21, 2022 (FR) ....................................... 2207485

(51) Int. Cl.
*H10D 8/60* (2025.01)
*H10D 8/01* (2025.01)
*H10D 62/10* (2025.01)

(52) U.S. Cl.
CPC ............. *H10D 8/605* (2025.01); *H10D 8/051* (2025.01); *H10D 62/106* (2025.01)

(58) Field of Classification Search
None
See application file for complete search history.

(56) References Cited

U.S. PATENT DOCUMENTS 10,096,723 B1 * 10/2018 Ningaraju .............. H10D 8/051
2006/0125039 A1 6/2006 Levin et al.
2011/0227135 A1 9/2011 Lin et al.
2012/0326317 A1 * 12/2012 Wu ................... H01L 21/26506 257/E21.59
2015/0346520 A1 * 12/2015 Lee ......................... G02F 1/025 385/2
2016/0172458 A1 6/2016 Quddus et al.
2019/0115436 A1 * 4/2019 Hossain ............... H10D 64/513

OTHER PUBLICATIONS

INPI Search Report and Written Opinion for priority application, FR Appl. No. 2207485, report dated Mar. 2, 2023, 12 pgs.

* cited by examiner

*Primary Examiner* — Xiaoming Liu
(74) *Attorney, Agent, or Firm* — Crowe & Dunlevy LLC

(57) ABSTRACT

A semiconductor device includes a Schottky diode on a substrate. The Schottky diode includes a layer of polysilicon disposed on a dielectric layer within the substrate that is configured to electrically insulate the layer of polysilicon from the substrate. The layer of polysilicon includes an N-type doped first cathode region adjacent to an undoped second anode region. A first metal contact is disposed on a surface of the N-type doped first cathode region and a second metal contact is disposed on a surface of the undoped second anode region. The first metal contact and second metal contact are electrically insulated from each other by an insulating layer on the layer of polysilicon.

16 Claims, 7 Drawing Sheets

METHOD FOR MANUFACTURING A SCHOTTKY DIODE AND CORRESPONDING INTEGRATED CIRCUIT

PRIORITY CLAIM

This application claims the priority benefit of French Application for Patent No. 2207485, filed on Jul. 21, 2022, the content of which is hereby incorporated by reference in its entirety to the maximum extent allowable by law.

TECHNICAL FIELD

Embodiments and implementations relate to integrated circuits, in particular methods for manufacturing Schottky diodes.

BACKGROUND

A Schottky diode is an electronic component used for the protection of integrated circuits against electrostatic discharges. An integrated circuit may be provided in an electronic system manufactured from a common substrate and may, for example, be designed with a Schottky diode to reduce the injection of currents into the substrate, especially currents from other circuits in the system during operation thereof.

The Schottky diode typically has a relatively low voltage threshold and may be forward or reverse biased depending on the voltage applied between the semiconducting region (the cathode) and the conductive region (the anode) of the Schottky diode. In particular, metal contacts are typically provided on the anode and cathode and allow a circuit to be connected to the anode and cathode.

In a forward bias, the current flows from the anode to the cathode through an N-type doped semiconductor box, usually buried in a P-type doped substrate. In particular, the anode forms, with the semiconductor box, a junction electrically insulated from the cathode by a dielectric layer. The dielectric layer also ensures that the metal contacts of the anode and cathode regions are sufficiently far apart to avoid a short circuit when the current passes.

However, the dielectric layer has angular ends at which electric field lines generated between the anode and cathode become abrupt, thus causing greater current leakage into the substrate and a decrease in breakdown voltage between the anode and cathode. A lower breakdown voltage increases the risk of destruction of the diode when the latter is biased by a voltage higher than the breakdown voltage.

In this respect, a conventional Schottky diode structure provides for the implantation of heavily P-type doped regions, with ion concentration typically between $1\times10^{12}$ and $1\times10^{16}$ atoms/cm$^3$, between the anode and the dielectric layer. In particular, these implantation regions, often in the form of a ring, allow the electric field lines at the ends of the dielectric layer to be smoothed.

However, the junctions formed by combination of the heavily P-doped implant regions, the N-doped semiconductor box and the P-doped substrate may mimic the behavior of a bipolar transistor within the Schottky diode structure and may therefore lead to parasitic effects, which may hereafter be referred to as "parasitic bipolar transistor" of the diode.

More particularly, these effects can be the formation of a parasitic capacitance and a generation of parasitic currents that can flow in the substrate both in reverse biasing, that is, when the current flows from the cathode to the anode, and in forward biasing of the diode via these junctions. This leaves an unwanted current generated by the Schottky diode in addition to the current injected by the various circuits in the system flowing through the common substrate.

Therefore, there is a need in the art to provide a solution for designing a Schottky diode that does not have parasitic currents in its substrate and that allows the injection of currents to be limited within an electronic system.

SUMMARY

In one aspect, there is provided a semiconductor device comprising at least one Schottky diode on a substrate, said at least one Schottky diode including a layer of polysilicon disposed on a dielectric layer extending deep into the substrate and adapted to electrically insulate the layer of polysilicon from the substrate, the layer of polysilicon having at least one N-type doped first region called the cathode region, adjacent to at least one undoped second region, called the anode region, a first metal contact disposed on the surface of said at least one first region and a second metal contact disposed on the surface of said at least one second region so that said first metal contact and said second metal contact are adapted to be electrically insulated from each other.

In other words, there is provided a Schottky diode having a particular topology in which the anode and cathode are located above the dielectric layer. This particular topology prevents excessively abrupt electric field lines from occurring between the anode and cathode and therefore does not require the implantation of heavily P-type doped regions at the metal-semiconductor junction of the diode to smooth these electric field lines.

As a result, the Schottky diode does not suffer from the parasitic effects associated with the "parasitic bipolar transistor" such as unwanted currents and capacitances.

In addition, the dielectric layer between the diode and the substrate limits or even prevents the passage of current between the Schottky diode and the substrate, especially currents generated by the "parasitic bipolar transistor".

According to one embodiment, said first metal contact and said second metal contact are insulated from each other by a layer of oxide extending over the layer of polysilicon.

The layer of oxide guarantees electrical insulation between the first metal contact and the second metal contact. Indeed, the metal contacts serve to flow a current through each anode and cathode and can be insulated from each other by the layer of oxide to avoid electrical interference between the different anode and cathode regions.

According to one embodiment, the material of the metal contacts is a nickel-platinum alloy.

A nickel-platinum alloy has advantageous electrical conduction characteristics.

According to one embodiment, the device further comprises at least one non-volatile memory cell including an N-type doped stack of polysilicon and a metal contact disposed on the surface of said stack of polysilicon. Advantageously: said stack of polysilicon has the same thickness, composition and dopant concentration as the first region of the layer of polysilicon, and said metal contact has the same composition as the first metal contact and the second metal contact.

According to one embodiment, the device further comprises at least one low-voltage MOS transistor comprising a polysilicon gate region, N-type doped conductive regions and a metal contact disposed on the surface of said gate region. Advantageously: said polysilicon gate region has the same thickness and composition as the layer of polysilicon, said conductive regions have the same dopant concentration as the first region of the layer of polysilicon, and said metal contact has the same composition as the first metal contact and the second metal contact.

According to another aspect, there is also provided a system for protection against the injection of current into the substrate, comprising a circuit capable of generating currents in the substrate, the semiconductor device as previously defined, wherein said at least one Schottky diode is coupled in parallel to the circuit and configured to limit or even eliminate currents generated by the circuit in the substrate.

A device including a Schottky diode according to this aspect advantageously reduces or even eliminates the injections of current into the substrate of different circuits in a same system.

According to another aspect, there is provided a method for manufacturing at least one Schottky diode on a substrate comprising: forming a dielectric layer in the substrate so that the dielectric layer extends deep into the substrate; forming a layer of polysilicon on the dielectric layer, the dielectric layer being adapted to electrically insulate the layer of polysilicon from the substrate; doping the layer of polysilicon so as to form at least one N-type doped first region, called the cathode region, adjacent to at least one undoped second region, called the anode region, of the layer of polysilicon; and forming a first metal contact on the surface of said at least one first region and a second metal contact on the surface of said at least one second region so that said first metal contact and said second metal contact are adapted to be electrically insulated from each other.

According to one implementation, doping the layer of polysilicon comprises masking and etching adapted to form openings at said at least one first region of the layer of polysilicon and ion implantation onto the layer of polysilicon at said openings.

The different doped regions can thus be formed simultaneously at specific locations in the layer of polysilicon.

According to one implementation, forming the first metal contact and the second metal contact comprises: forming a layer of oxide extending over the layer of polysilicon; etching the layer of oxide partially uncovering said at least one first region and said at least one second region of the layer of polysilicon; and silicifying on the surface of said at least one first region and on the surface of said at least one second region so that said first metal contact and said second metal contact are insulated from each other by the layer of oxide.

According to one implementation, the material of the metal contacts is a nickel-platinum alloy.

According to one implementation, the method further includes manufacturing at least one non-volatile memory cell comprising: forming a stack of polysilicon performed simultaneously with forming the layer of polysilicon; N-type doping said stack of polysilicon performed simultaneously with doping the layer of polysilicon; and forming a metal contact on the surface of said stack of polysilicon performed simultaneously with forming the first metal contact and the second metal contact.

A co-integration of Schottky diodes with non-volatile memory cells allows the Schottky diodes to be manufactured "free of charge" in a same method, especially during the common steps of forming, doping the layer of polysilicon and forming the metal contacts. By "free of charge", it is meant that the method does not require additional steps dedicated exclusively to forming the Schottky diodes and thus allows the number of steps for manufacturing the IC semiconductor device to be reduced, which thus reduces the cost and production time of such an IC device.

According to one implementation, the method further includes manufacturing at least one low-voltage MOS transistor comprising: forming a polysilicon gate region performed simultaneously with forming the layer of polysilicon; forming N-type doped conductive regions performed simultaneously with doping the layer of polysilicon; and forming a metal contact on the surface of said gate region performed simultaneously with forming the first metal contact and the second metal contact.

A co-integration of Schottky diodes with MOS transistors allows the Schottky diodes to be manufactured "free of charge" in a same method, especially during the steps of forming the gate, source and drain regions as well as when forming the metal contacts. By "free of charge", it is meant that the method does not require additional steps dedicated exclusively to forming the Schottky diodes and thus allows the number of steps for manufacturing the IC semiconductor device to be reduced, which thus reduces the cost and production time of such an IC device.

BRIEF DESCRIPTION OF THE DRAWINGS

Further advantages and characteristics of the invention will become apparent upon examining the detailed description of non-limiting embodiments and implementations and the attached drawings in which.

DETAILED DESCRIPTION

Figure 1:
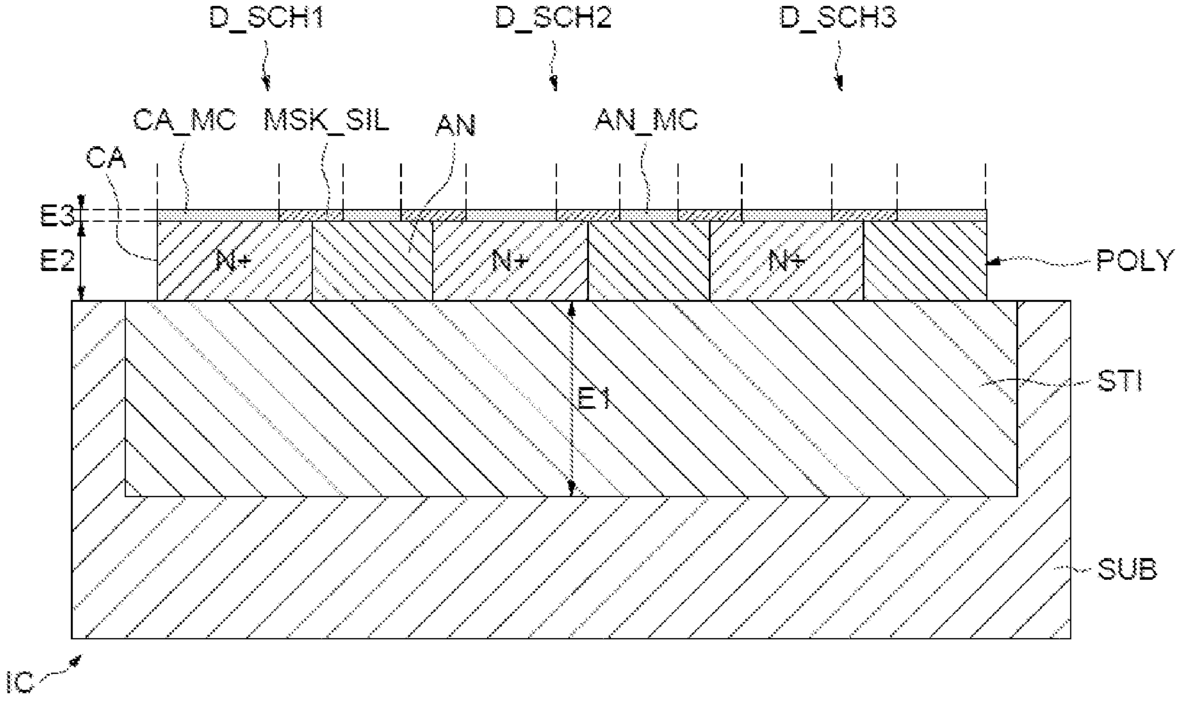
FIG. 1 schematically illustrates an IC semiconductor device comprising at least one Schottky diode.

FIG. 1 schematically illustrates an IC semiconductor device comprising at least one Schottky diode, for example three diodes D_SCH1, D_SCH2 and D_SCH3, on a substrate SUB. The material of the substrate SUB is typically silicon. The diodes D_SCH1, D_SCH2 and D_SCH3 include a layer of polysilicon POLY disposed on a dielectric layer STI.

The dielectric layer STI is typically a shallow trench isolation and is adapted to electrically insulate the layer of polysilicon POLY from the substrate SUB. The dielectric layer STI extends deep into the substrate SUB, for example from the surface of the substrate SUB, and has a thickness E1 of between 200 nm and 1000 nm.

The layer of polysilicon POLY, also referred to as poly-Si, is preferably a common layer for the diodes D_SCH1, D_SCH2 and D_SCH3 and has a thickness E2 between 50 nm and 200 nm.

Each Schottky diode D_SCH1, D_SCH2 and D_SCH3 includes a junction comprising a cathode region, corresponding to a first region CA of the layer of polysilicon POLY, and an anode region corresponding to a second region AN of the layer of polysilicon POLY. The first region CA is N-type doped unlike the second region AN which is undoped. The first region CA has an ion concentration between $1\times10^{13}$ and $1\times10^{16}$ atoms/$cm^3$.

Moreover, the Schottky diodes D_SCH1, D_SCH2 and D_SCH3 include a first metal contact CA_MC and a second metal contact AN_MC. The first metal contact CA_MC is disposed on the surface of the first region CA of each of the diodes and the second metal contact AN_MC is disposed on the surface of the second region AN of each of the diodes. The first metal contact CA_MC and the second metal contact AN_MC are electrically insulated from each other. In particular, the first metal contact CA_MC and the second metal contact AN_MC are sufficiently far apart to prevent any electrical connection between the first contact CA_MC and the second contact AN_MC. The person skilled in the art will be able to determine the distance between the first metal contact CA_MC and the second metal contact AN_MC to enable them to be electrically insulated. For example, a distance of between 100 nm and 2 μm may be provided.

Advantageously, the first metal contact CA_MC and the second metal contact AN_MC are insulated from each other by a layer of oxide MSK_SIL extending over the layer of polysilicon POLY. The material of the layer of oxide MSK_SIL can be silicon oxide $SiO_2$ for example. The layer of oxide MSK_SIL has a thickness E3 between 1 nm and 50 nm.

The layer of oxide MSK_SIL guarantees better electrical insulation between the first metal contact and the second metal contact.

The respective first contact CA_MC and second contact AN_MC of each of the diodes D_SCH1, D_SCH2 and D_SCH3 allow an electronic circuit (not represented) to be connected to the anode and cathode of each of the diodes. In particular, the first contact CA_MC allows a current to flow in the first region CA and the second contact AN_MC allows a current to flow in the second region AN. Furthermore, the electrical insulation between the first contact CA_MC and the second contact AN_MC prevents the passage of current between the first contact CA_MC and the second region AN and the passage of current between the second contact AN_MC and the first region CA. Thus, electrical interference between the diodes D_SCH1, D_SCH2 and D_SCH3 is limited.

Each Schottky diode has a particular topology in which the anode and cathode are located above the dielectric layer STI. This particular topology prevents excessively abrupt electric field lines from occurring between the anode and cathode and therefore does not require the implantation of P-doped regions at the metal-semiconductor junction of each diode to smooth these electric field lines.

As a result, each of the Schottky diodes does not suffer from the parasitic effects associated with the "parasitic bipolar transistor" such as unwanted currents and capacitances.

Moreover, the dielectric layer STI located between the diodes D_SCH1, D_SCH2 and D_SCH3 and the substrate SUB makes it possible to limit or even prevent the passage of a current between the diodes and the substrate, especially the currents generated by the "parasitic bipolar transistor".

Advantageously, the material of the first metal contact CA_MC and of the second metal contact AN_MC is a nickel-platinum alloy of the chemical formula NiPt. The nickel-platinum alloy is indeed resistant to oxidation at room temperature and has a relatively high conductivity.

Figure 2:
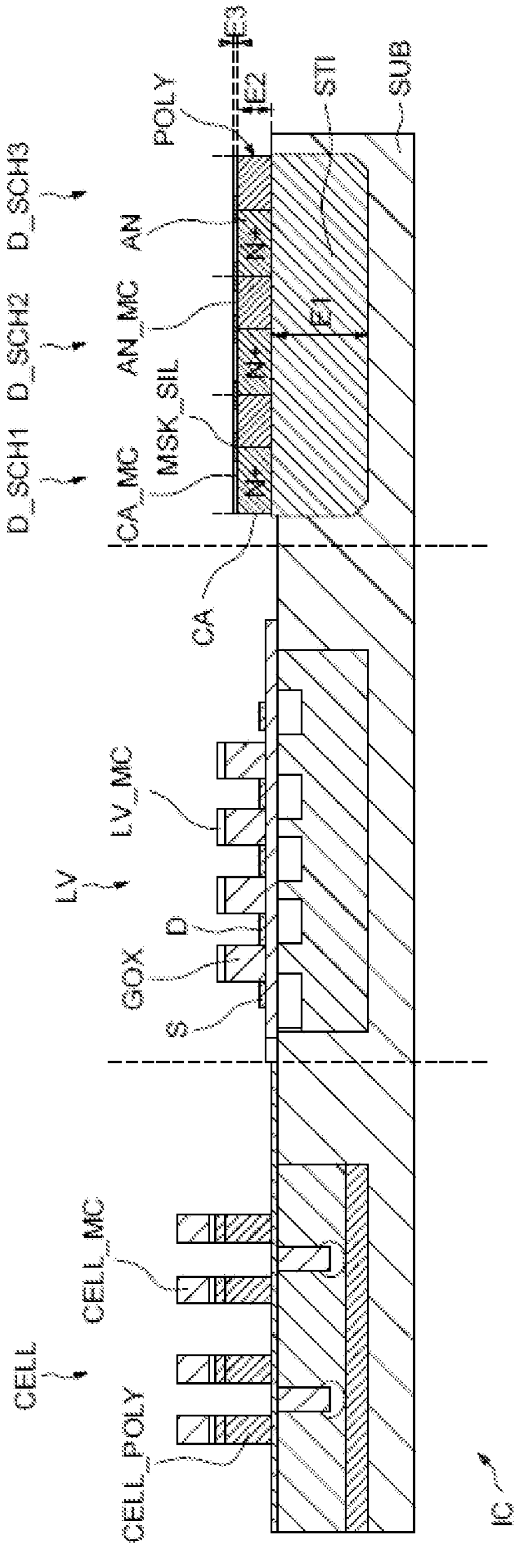
FIG. 2 schematically illustrates an alternative IC semiconductor device.

FIG. 2 schematically illustrates an alternative IC semiconductor device, in which the diodes D_SCH1, D_SCH2 and D_SCH3 have been manufactured in co-integration with other electronic components. By "co-integration", it is meant that the Schottky diodes can be manufactured together with other components in a common manufacturing method which may especially include the steps of manufacturing the diodes and the other components performed simultaneously, as described in the following.

More particularly, the IC semiconductor device comprises at least one non-volatile memory cell CELL, for example two memory cells, and at least one low-voltage MOS transistor LV, for example four low-voltage transistors.

The memory cells CELL each include an N-type doped stack of polysilicon CELL_POLY and a metal contact CELL_MC disposed on the surface of the stack of polysilicon CELL_POLY.

The stack of polysilicon CELL_POLY has the same thickness E2, composition and dopant concentration as the first region CA of the layer of polysilicon POLY.

Furthermore, the metal contact CELL_MC has the same composition as the first metal contact CA_MC and the second metal contact AN_MC.

The low-voltage MOS transistors LV each comprise a polysilicon gate region GOX and N-doped type conductive regions, that is, a source region S and a drain region D. Furthermore, the low-voltage MOS transistors LV comprise a metal contact LV_MC disposed on the surface of the gate region GOX.

The polysilicon gate region GOX has the same thickness E2 and composition as the layer of polysilicon POLY and the conductive regions S, D have the same dopant concentration as the first region CA of the layer of polysilicon POLY.

Furthermore, the metal contact LV_MC has the same composition as the first metal contact CA_MC and the second metal contact AN_MC.

Figure 3:
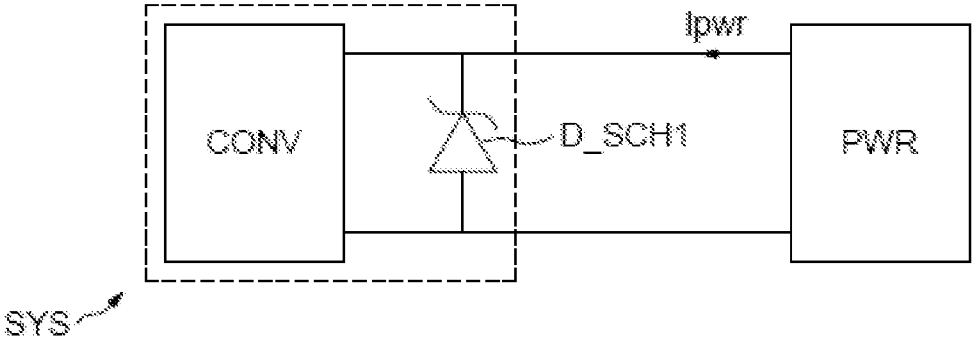
FIG. 3 illustrates a protection system against the injections of current into the substrate.

FIG. 3 illustrates a protection system SYS against the injections of current into the substrate SUB.

The system SYS comprises a circuit CONV and the semiconductor device as previously described in relation to FIG. 1 or 2. The circuit CONV may be a direct voltage converter (usually referred to as "DC-DC converter" or "direct current-direct current converter") for example. The circuit CONV may be connected to a power source PWR for supplying a direct current Ipwr to the circuit CONV.

At least one of the Schottky diodes D_SCH1, D_SCH2 and D_SCH3, for example diode D_SCH1, is coupled in parallel to the circuit CONV between the circuit CONV and the power source PWR. The diode D_SCH1 is thus configured to limit, or even eliminate, the injection of part of the current Ipwr by the circuit CONV into the substrate SUB.

Figure 4:
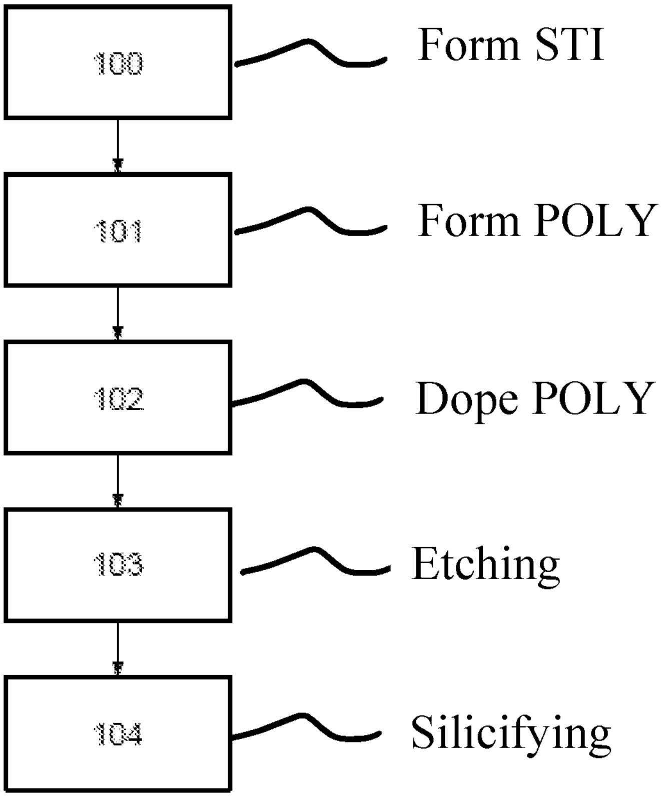
FIG. 4 schematically illustrates an implementation of a method for manufacturing Schottky diodes.

FIG. 4 schematically illustrates an implementation of a method for manufacturing Schottky diodes D_SCH1, D_SCH2 and D_SCH3. Such a manufacturing method is used to form an IC semiconductor device, as represented in FIGS. 1 and 2.

Figure 5:
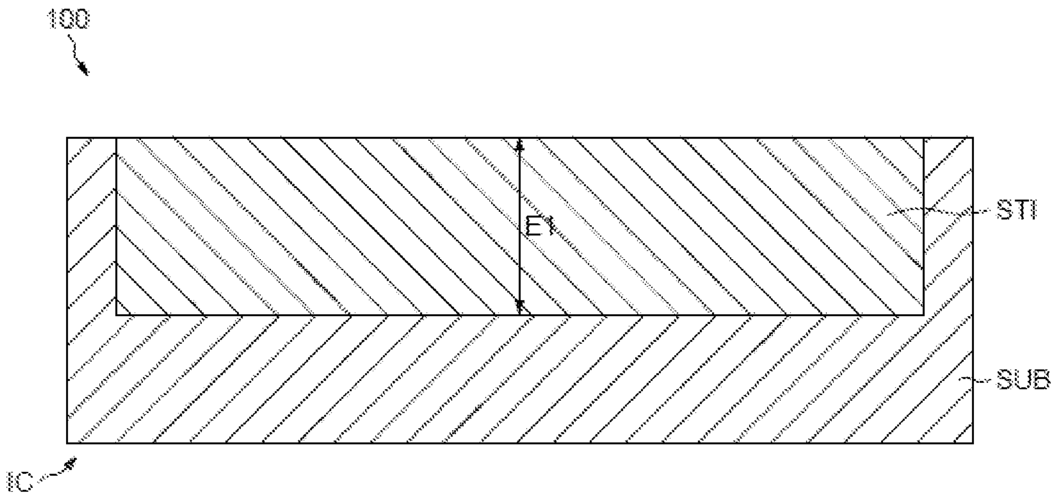
FIG. 5 schematically illustrates a result of the formation of a dielectric layer in a cross-sectional view.

The method comprises forming 100 a dielectric layer STI in a substrate SUB. FIG. 5 schematically illustrates a result of the formation 100 of the dielectric layer STI in a cross-sectional view.

The dielectric layer STI is known to be formed between electronic components of an integrated circuit to prevent current leakage from one component to another. As will be described later, the method advantageously uses such a dielectric layer STI not only to insulate two components located next to each other, but also to insulate the substrate SUB from components that may be formed later above the dielectric layer STI, such as Schottky diodes D_SCH1, D_SCH2 and D_SCH3.

Forming 100 the dielectric layer STI may be achieved by etching the silicon of the substrate SUB so as to form a trench deep in the substrate SUB and filling the trench with a dielectric material, such as silicon dioxide of the chemical formula $SiO_2$ for example. The electrical insulation capacity of the dielectric layer depends on several factors such as the choice of the dielectric material and the thickness of the dielectric layer STI.

Indeed, the dielectric layer STI can have a thickness E1 between 200 nm and 1000 nm.

Figure 6:
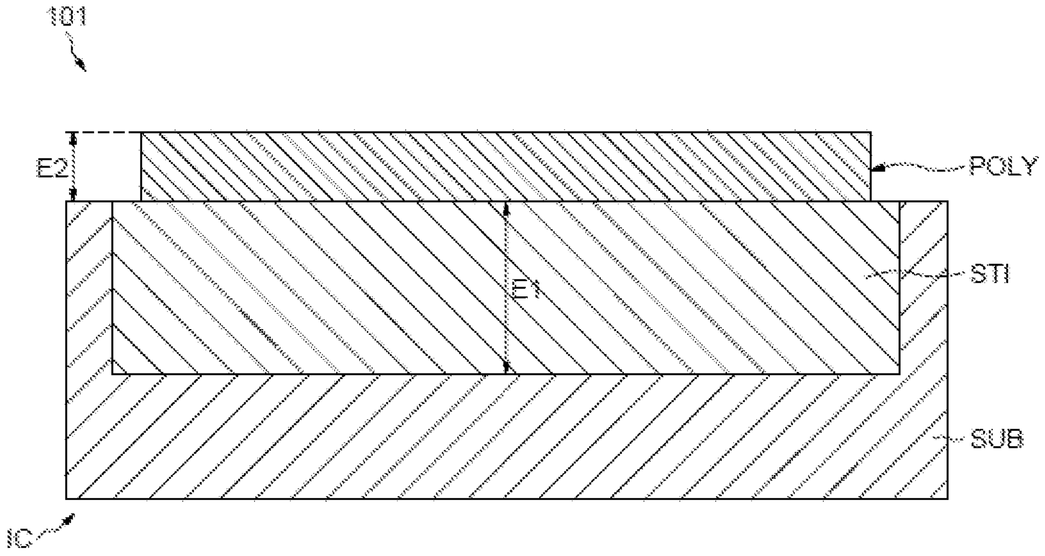
FIG. 6 schematically illustrates a result of the formation of a layer of polysilicon in a cross-sectional view.

The method also comprises forming 101 a layer of polysilicon POLY on the dielectric layer STI. FIG. 6 schematically illustrates a result of the formation 101 of the layer of polysilicon POLY in a cross-sectional view.

As previously explained, the dielectric layer STI is provided to electrically insulate the layer of polysilicon POLY from the substrate SUB. The layer of polysilicon POLY can be, for example, formed by low pressure chemical vapor deposition, more commonly known as "LPCVD".

The layer of polysilicon POLY can cover the dielectric layer STI either fully or partially, so as not to be in direct contact with the substrate SUB.

Figure 7:
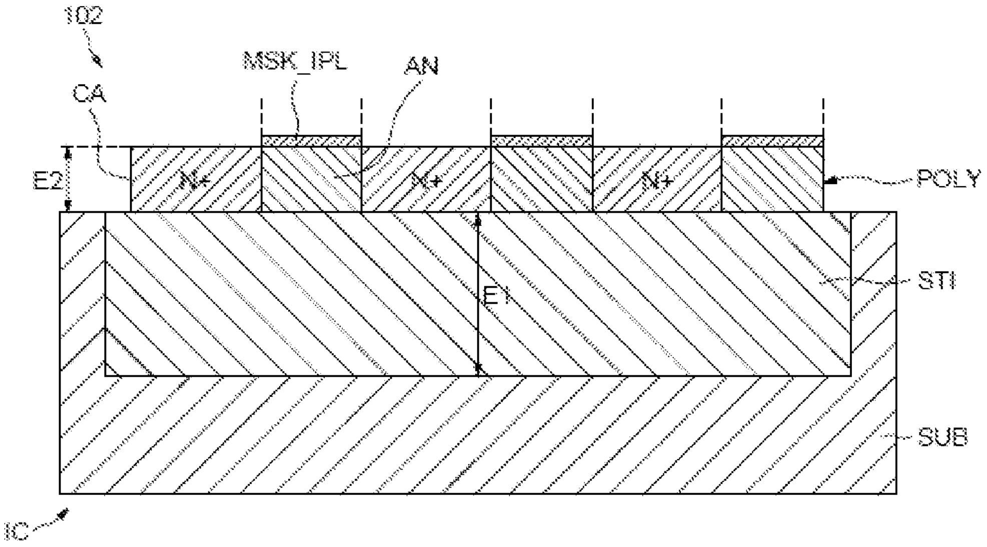
FIG. 7 illustrates an example of masking and etching.

The method comprises doping 102 the layer of polysilicon POLY. FIG. 7 schematically illustrates doping 102 of the layer of polysilicon POLY, especially during an ion implantation step, in a cross-sectional view. Doping 102 is performed so as to form at least one N-type doped first region CA, for example three regions, of the layer of polysilicon POLY adjacent to at least one undoped second region AN, for example three regions, of the layer of polysilicon POLY. The steps to achieve the doping 102 are detailed below and are by no means limiting.

First, masking and etching are performed on the layer of polysilicon POLY. An example of masking and etching is represented in FIG. 7 in which a mask MSK_IPL was previously formed on the layer of polysilicon POLY and then etched.

In particular, masking and etching is configured to form openings at the first regions CA of the layer of polysilicon POLY.

Ion implantation is then performed on the layer of polysilicon POLY at said openings. Ions are implanted into the first regions CA located under the openings of the mask MSK_IPL. Preferably, the ion concentration of the first regions CA after doping is between $1\times10^{12}$ and $1\times10^{16}$ atoms/$cm^3$. The mask MSK_IPL prevents ions from reaching the second regions AN covered by the mask MSK_IPL.

For example, the first regions CA can be doped in the same way as the source and drain regions of a MOS transistor or low-doped drain regions, usually called "LDD" regions. In this case, the first regions CA have an ion concentration of less than $1\times10^{15}$ atoms/$cm^3$. Co-integration with MOS transistors can thus be facilitated by choosing one or other of these doping types.

The first regions CA can also be pre-doped, which can be advantageous for co-integration with memory cells CELL.

Following ion implantation, removal of the mask MSK_IPL can be carried out (not represented) revealing the surfaces of the first N-type doped regions CA, corresponding to cathode regions, and the undoped second regions AN, corresponding to anode regions of the diodes D_SCH1, D_SCH2 and D_SCH3.

The method comprises forming metal contacts CA_MC and AN_MC on the surface of the layer of polysilicon POLY. Forming the metal contacts comprises etching 103 a layer of oxide MSK_SIL and silicifying 104 performed on the surface of the first regions CA and the second regions AN of the layer of polysilicon POLY.

Figure 8:
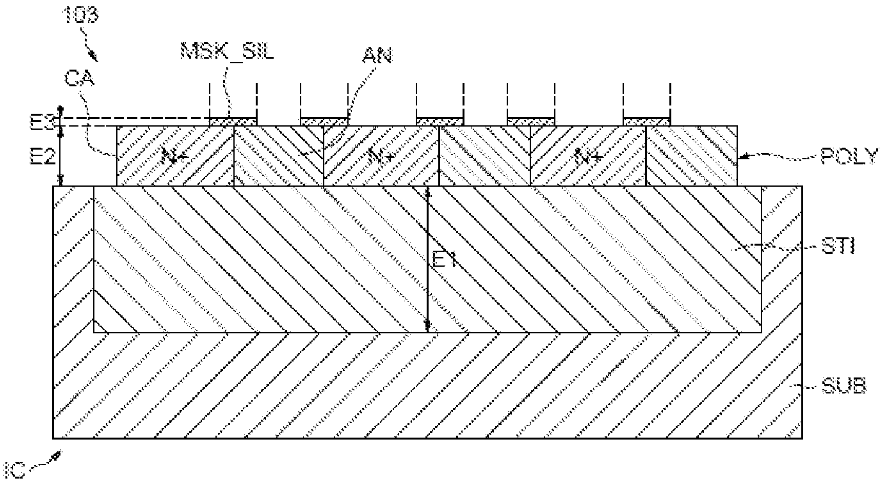
FIG. 8 schematically illustrates a result of the formation and etching of a layer of oxide in a cross-sectional view.

FIG. 8 schematically illustrates the result of the formation and etching 103 of the layer of oxide MSK_SIL in a cross-sectional view.

The layer of oxide MSK_SIL extends over the layer of polysilicon POLY and covers the surfaces of the first regions CA and the second regions AN. The material of the layer of oxide MSK_SIL may be, for example, silicon oxide ($SiO_2$).

The etching 103 of the layer of oxide MSK_SIL partially uncovers the first regions CA and the second regions AN of the layer of polysilicon POLY. More particularly, etching 103 removes the layer of oxide MSK_SIL on both sides of the junctions between the first regions CA and the second regions AN.

On the one hand, the layer of oxide MSK_SIL, in the manner of a mask, prevents the formation of metal contacts on or in proximity to the junctions between the first regions CA and the second regions AN and, on the other hand, forms openings at the locations where the layer of oxide MSK_SIL has been etched.

Figure 9:
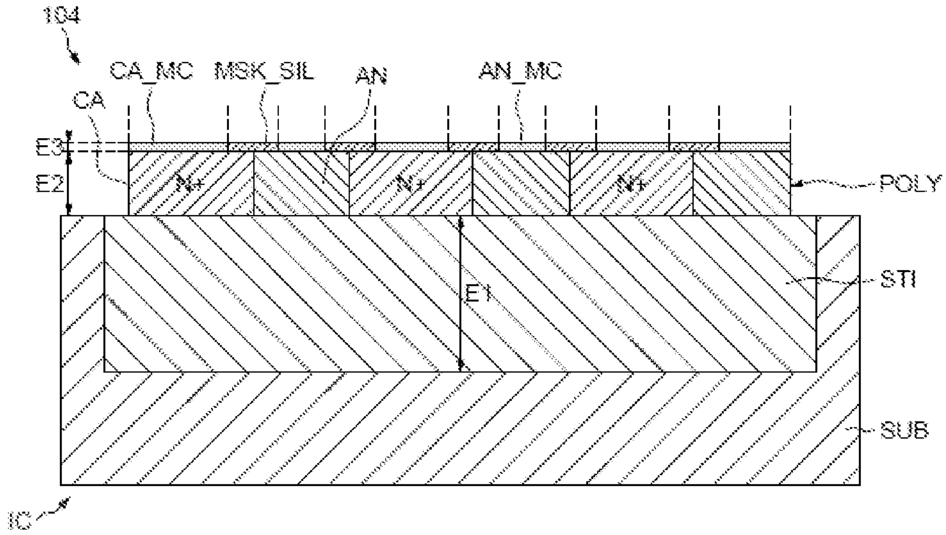
FIG. 9 schematically illustrates a result of a silicifying in a cross-sectional view.

FIG. 9 schematically illustrates the result of the silicifying 104 in a cross-sectional view.

Silicifying 104 is performed on the surface of the first regions CA and the second regions AN of the layer of polysilicon POLY, under the openings formed by the mask MSK_SIL. Silicifying 104 is a technique well known to the person skilled in the art for transforming the polycrystalline silicon on the surface of the first regions CA and the second regions AN into a silicide by chemical reaction.

In particular, the silicide can be obtained by diffusing metals into the silicon. For example, metals such as platinum and nickel can be diffused into the layer of polysilicon POLY through the openings to form a layer of silicide of a nickel-platinum alloy (NiPt). Silicifying 104 improves the ohmic contact between the layer of silicide and the layer of polysilicon POLY.

As a result, the layers of silicide form first metal contacts CA_MC on the surface of the first regions CA and second metal contacts AN_MC on the surface of the second regions AN.

Moreover, the first metal contacts CA_MC and the second metal contacts AN_MC are adapted to be insulated from each other by the layer of oxide MSK_SIL.

Figure 10:
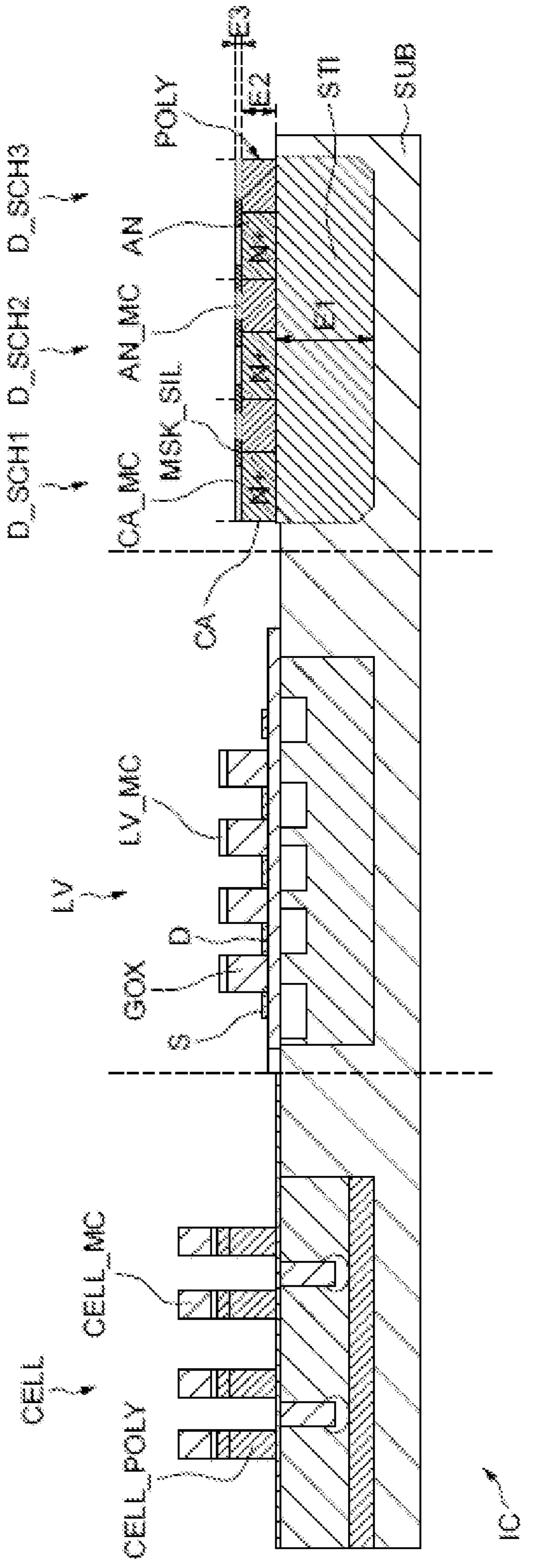
FIG. 10 schematically illustrates forming a layer of polysilicon simultaneously for the manufacturing of memory cells and diodes.

FIG. 10 illustrates the method for manufacturing Schottky diodes D_SCH1, D_SCH2 and D_SCH3 according to a further alternative to obtain the semiconductor device described in relation to FIG. 2.

The method according to this alternative comprises forming 101 the layer of polysilicon POLY, doping 102 the layer of polysilicon POLY and forming the metal contacts CA_MC and AN_MC as previously described in relation to FIGS. 6, 7, 8 and 9 in co-integration with other electronic components.

On the one hand, the method may comprise manufacturing non-volatile memory cells CELL. Forming 101 the layer of polysilicon POLY is performed simultaneously for the manufacturing of memory cells CELL and diodes D_SCH1, D_SCH2 and D_SCH3 as schematically illustrated in FIG. 10.

On the other hand, the method may comprise manufacturing low-voltage MOS transistors LV. Manufacturing low-voltage MOS transistors LV comprises forming polysilicon gate regions GOX performed simultaneously with forming 101 the layer of polysilicon POLY.

Manufacturing the non-volatile memory cells CELL comprises forming a stack of polysilicon CELL_POLY and N-type doping of the stack of polysilicon CELL_POLY. Forming the stack of polysilicon CELL_POLY is performed simultaneously with forming the layer of polysilicon POLY. N-type doping of the stack of polysilicon CELL_POLY is performed simultaneously with doping the layer of polysilicon POLY. The stack of polysilicon CELL_POLY can be doped with any of the ion implantations previously mentioned as an example. Manufacturing the non-volatile memory cells CELL also includes forming a metal contact CELL_MC on the surface of the stack of polysilicon CELL_POLY. Forming the metal contact CELL_MC is performed simultaneously with forming the first metal contact CA_MC and the second metal contact AN_MC.

Manufacturing the low-voltage MOS transistors LV also includes forming conductive regions, that is, a source region S and a drain region D, and forming a metal contact LV_MC on the surface of the gate region GOX. Forming the conductive regions is performed simultaneously with doping 102 the layer of polysilicon POLY. More particularly, doping 102 allows N-type doping to be applied, for example by one of the examples of ion implantation previously mentioned, to form the cathode regions CA of the diodes D_SCH1, D_SCH2 and D_SCH3 and the semiconducting regions of the LV low-voltage MOS transistors.

Forming a metal contact LV_MC on the surface of the gate region GOX is performed simultaneously with forming 103 the first metal contact CA_MC and the second metal contact AN_MC.

Manufacturing Schottky diodes D_SCH1, D_SCH2 and D_SCH3 according to this alternative allows the Schottky diodes to be manufactured "free of charge" in the same method, especially during the steps common to the manufacture of memory cells CELL and/or LV low-voltage MOS transistors. By "free of charge", it is meant that the method does not require additional steps dedicated exclusively to forming the Schottky diodes D_SCH1, D_SCH2 and D_SCH3 and thus allows the number of steps for manufacturing the IC semiconductor device to be reduced, which thus reduces the cost and production time of such an IC device.

The invention claimed is:

1. A semiconductor device including:
at least one Schottky diode, comprising:
a substrate;
a dielectric layer extending into the substrate;
a layer of polysilicon disposed on the dielectric layer which electrically insulates the layer of polysilicon from the substrate;
wherein the layer of polysilicon includes at least one N-type doped first cathode region for the at least one Schottky diode that is adjacent to at least one undoped second anode region for the at least one Schottky diode;
a first metal contact disposed on a surface of said at least one N-type doped first cathode region;
a second metal contact disposed on a surface of said at least one undoped second anode region; and
an electrical insulation on the layer of polysilicon electrically insulating said first metal contact from said second metal contact; and
at least one non-volatile memory cell, wherein said at least one non-volatile memory cell comprises an N-type doped stack of polysilicon and a metal contact disposed on a surface of said N-type doped stack of polysilicon, wherein:
said N-type doped stack of polysilicon has a same thickness, composition and dopant concentration as the N-type doped first cathode region of the layer of polysilicon; and
said metal contact has a same composition as the first metal contact and the second metal contact.

2. The semiconductor device according to claim 1, wherein said electrical insulation comprises a layer of oxide extending over the layer of polysilicon between the first metal contact and said second metal contact.

3. The semiconductor device according to claim 1, wherein a material of the first and second metal contacts is a nickel-platinum alloy.

4. The semiconductor device according to claim 1, further including a circuit configured to generate currents in the substrate; wherein said at least one Schottky diode is coupled in parallel to the circuit and configured to limit currents generated by the circuit being injected in the substrate.

5. A semiconductor device including:
at least one Schottky diode, comprising:
a substrate;
a dielectric layer extending into the substrate;
a layer of polysilicon disposed on the dielectric layer which electrically insulates the layer of polysilicon from the substrate;
wherein the layer of polysilicon includes at least one N-type doped first cathode region for the at least one Schottky diode that is adjacent to at least one undoped second anode region for the at least one Schottky diode;
a first metal contact disposed on a surface of said at least one N-type doped first cathode region;
a second metal contact disposed on a surface of said at least one undoped second anode region; and
an electrical insulation on the layer of polysilicon electrically insulating said first metal contact from said second metal contact; and
at least one low-voltage MOS transistor, wherein the at least one low-voltage MOS transistor comprises a polysilicon gate region, N-type doped conductive regions in the substrate and a metal contact disposed on a surface of the polysilicon gate region, wherein:
said polysilicon gate region has a same thickness and composition as the layer of polysilicon;
said N-type doped conductive regions have a same dopant concentration as the N-type doped first cathode region of the layer of polysilicon; and
said metal contact has a same composition as the first metal contact and the second metal contact.

6. The semiconductor device according to claim 5, wherein said electrical insulation comprises a layer of oxide extending over the layer of polysilicon between the first metal contact and said second metal contact.

7. The semiconductor device according to claim 5, wherein a material of the first and second metal contacts is a nickel-platinum alloy.

8. The semiconductor device according to claim 5, further including a circuit configured to generate currents in the substrate; wherein said at least one Schottky diode is coupled in parallel to the circuit and configured to limit currents generated by the circuit being injected in the substrate.

9. A method, including:

manufacturing at least one Schottky diode comprising:

forming a dielectric layer in a substrate so that the dielectric layer extends into the substrate;

forming a layer of polysilicon on the dielectric layer, the dielectric layer configured to electrically insulate the layer of polysilicon from the substrate;

doping the layer of polysilicon to form at least one N-type doped first cathode region adjacent to at least one undoped second anode region of the layer of polysilicon, said at least one N-type doped first cathode region and said at least one undoped second anode region forming the at least one Schottky diode;

forming a first metal contact on a surface of said at least one N-type doped first cathode region;

forming a second metal contact on a surface of said at least one undoped second anode region; and electrically insulating said first metal contact from and said second metal contact; and manufacturing at least one non-volatile memory cell comprising:

forming a stack of polysilicon simultaneously with forming the layer of polysilicon;

N-type doping said stack of polysilicon simultaneously with doping the layer of polysilicon; and forming a metal contact on a surface of said stack of polysilicon simultaneously with forming the first metal contact and the second metal contact.

10. The method according to claim 9, wherein doping the layer of polysilicon comprises masking and etching to form openings at said at least one N-type doped first cathode region of the layer of polysilicon and ion implantation onto the layer of polysilicon at said openings.

11. The method according to claim 9, wherein forming the first metal contact and forming the second metal contact comprises:

forming a layer of oxide extending over the layer of polysilicon;

etching the layer of oxide partially uncovering said at least one N-type doped first cathode region of the layer of polysilicon and said at least one undoped second anode region of the layer of polysilicon; and silicifying on a surface of said at least one N-type doped first cathode region and on a surface of said at least one undoped second anode region so that said first metal contact and said second metal contact that are insulated from each other by the layer of oxide.

12. The method according to one of claim 11, wherein a material of the first and second metal contacts is a nickel-platinum alloy.

13. A method, including:

manufacturing at least one Schottky diode, comprising:

forming a dielectric layer in a substrate so that the dielectric layer extends into the substrate;

forming a layer of polysilicon on the dielectric layer, the dielectric layer configured to electrically insulate the layer of polysilicon from the substrate;

doping the layer of polysilicon to form at least one N-type doped first cathode region adjacent to at least one undoped second anode region of the layer of polysilicon, said at least one N-type doped first cathode region and said at least one undoped second anode region forming the at least one Schottky diode;

forming a first metal contact on a surface of said at least one N-type doped first cathode region;

forming a second metal contact on a surface of said at least one undoped second anode region; and electrically insulating said first metal contact from and said second metal contact; and manufacturing at least one low-voltage MOS transistor comprising:

forming a polysilicon gate region simultaneously with forming the layer of polysilicon;

forming N-type doped conductive regions in the substrate simultaneously with doping the layer of polysilicon; and forming a metal contact on a surface of said gate region simultaneously with forming the first metal contact and the second metal contact.

14. The method according to claim 13, wherein doping the layer of polysilicon comprises masking and etching to form openings at said at least one N-type doped first cathode region of the layer of polysilicon and ion implantation onto the layer of polysilicon at said openings.

15. The method according to claim 13, wherein forming the first metal contact and forming the second metal contact comprises:

forming a layer of oxide extending over the layer of polysilicon;

etching the layer of oxide partially uncovering said at least one N-type doped first cathode region of the layer of polysilicon and said at least one undoped second anode region of the layer of polysilicon; and silicifying on a surface of said at least one N-type doped first cathode region and on a surface of said at least one undoped second anode region so that said first metal contact and said second metal contact that are insulated from each other by the layer of oxide.

16. The method according to one of claim 15, wherein a material of the first and second metal contacts is a nickel-platinum alloy.

* * * * *